United States Patent [19]

Salzman

[11] Patent Number: 5,597,439
[45] Date of Patent: Jan. 28, 1997

[54] PROCESS GAS INLET AND DISTRIBUTION PASSAGES

[75] Inventor: Philip M. Salzman, San Jose, Calif.

[73] Assignee: Applied Materials, Inc., Santa Clara, Calif.

[21] Appl. No.: 329,584

[22] Filed: Oct. 26, 1994

[51] Int. Cl.$^6$ ................................................ B44C 1/22
[52] U.S. Cl. .................... 156/345; 156/643.1; 216/71
[58] Field of Search ........................ 156/643.1, 345 P; 216/67, 71; 204/298.31, 298.33

[56] References Cited

U.S. PATENT DOCUMENTS

| | | | |
|---|---|---|---|
| 4,230,515 | 10/1980 | Zajac | 204/298.33 X |
| 4,313,783 | 2/1982 | Davies et al. | 156/345 P |
| 4,342,901 | 8/1982 | Zajac | 204/298.33 X |
| 4,590,042 | 5/1986 | Drage | 204/298.33 X |
| 4,614,639 | 9/1986 | Hegedus et al. | 422/186.05 |
| 5,134,965 | 8/1992 | Tokuda et al. | 118/723 |
| 5,468,298 | 11/1995 | Lei et al. | 118/728 |

FOREIGN PATENT DOCUMENTS 63-179527  7/1988  Japan ........................ 302/205

*Primary Examiner*—William Powell
*Attorney, Agent, or Firm*—Janis Biksa

[57] ABSTRACT

An easy to modify, remove, clean, and replace gas distribution ring for a highly corrosive plasma etch substrate processing chamber is disclosed. Gas is provided to a gap between adjacent pieces in sealing a ceramic dome of the processing chamber to a lower wall section of processing chamber. The gap acts as a manifold type channel around the periphery of the processing chamber. The channel opening is obstructed by the gas distribution ring. The gas distribution ring includes a series of slots in its surface which control the gas flow pattern into the processing chamber. The gas flow pattern can be easily adjusted merely by changing one gas distribution ring to another gas distribution ring with the desired slot configuration. The gas flow passages can easily be cleaned by removing the process chamber dome which exposes the gas flow passages in the gas distribution ring.

21 Claims, 5 Drawing Sheets

PROCESS GAS INLET AND DISTRIBUTION PASSAGES

FIELD OF THE INVENTION

This invention relates to the routing and distribution of process gas as it flows into a processing chamber to react with the surface of a substrate being processed and in particular to structures used to route and distribute process gas about a plasma etch chamber.

BACKGROUND OF THE INVENTION

In substrate processing chambers, process gases are introduced which are intended to affect the substrate to be processed in a predictable and repeatable way with a uniform effect across the surface of the substrate. In many processing chambers the process gas interacts with electrical and magnetic fields to form a plasma which facilitates and accelerates the reaction taking place at the substrate surface.

Vacuum processing chambers are connected to a vacuum pumping system which continuously evacuates the introduced process gas. In some vacuum chambers the vacuum pumping system connects to a pumping channel which wholly or partially surrounds the substrate being processed in an attempt to remove the process gas uniformly from around the substrate. In other configurations a simple pipe nozzle in the side of the processing chamber provides a single vacuum port for the whole processing chamber. The gas flowing from the gas inlet openings to the single vacuum port creates a gas flow pattern within the chamber. Flow patterns/or flow regimes are designed so that they flow across the substrate.

The goal in processing a substrate is that the process gas promote deposit on or etch of each unit area of the substrate surface equally. To accomplish this objective, the molecules of the processing gas must be directed in such a manner that their reactants, whether for deposition or etching, contact the substrate surface generally equally in each unit area of the substrate surface. A non-uniform gas flow pattern can create undesirable variations in surface film thickness, which may result in defects. To prevent such defects substrate processing times are adjusted so that the range of predicted film variations due to non-uniform gas flow patterns are taken into account to assure that film coverage or etching is complete at each film layer.

In each new processing chamber and for each new process condition, the process gas flow pattern is subject to change and evaluation by extensive empirical testing until optimum process parameters and process gas distribution manifold configurations are identified. A single gas distribution nozzle pattern is rarely optimal for more than a small range of process conditions.

In instances where plasma is used to facilitate and/or accelerate the deposition or etch process taking place in processing chamber, the material deposited tends to deposit on or the etch gas etches away the processing chamber surfaces exposed to the plasma, including the surface opening(s) through which the process gas is introduced into the process chamber. Metal pieces are generally particularly susceptible to plasma corrosion. Since the openings introducing process gas into the processing chamber act as orifices/restrictions to limit the process gas flow into the chamber, a change in the opening size, due to deposited material or enlargement due to etching, affects the gas flow rate and the gas flow pattern across a substrate being processed. Cleaning and/or replacement of the gas flow passages into the processing chamber needs to take place regularly so that variations in substrate processing are not so great as to cause defects when the changes in size of the gas passage opening adversely affect the gas flow pattern and the uniformity of film thickness on the substrate. Variations in film thickness of a substrate being processed must be minimized to optimize the quality of substrate processing. Further, if gas nozzles become dirty they may suddenly release and spray particles around the chamber which can cause defects in the substrate.

To minimize variations in flow due to deposits in or erosion of the gas flow passages, the gas supply/distribution manifold needs to be constructed to provide easy access to gas flow passages, especially those openings leading directly into the processing chamber and facing the area in the processing chamber where plasma will be present for easy cleaning and/or replacement of components. Monitoring and cleaning or replacement of worn components will avoid noticeable variations in the gas flow that might alter the predetermined optimum gas flow pattern. Variations in the gas flow pattern must be minimized to provide increased uniformity in the deposition or etching of a substrate surface in the processing chamber. Reducing and simplifying the number of steps and the time needed to clean and/or replace those structures in the gas feed system which are subject to deposition and/or etching by virtue of their facing the plasma in the processing chamber would decrease the down time of the system, increase the process chamber throughput, and promote process uniformity across the wafer.

SUMMARY OF THE INVENTION

A configuration according to the invention provides an easy to clean, easy to optimize, and easy to replace gas distribution ring configured to face the plasma in a substrate processing chamber and thereby overcomes many of the difficulties described above.

A gas distribution ring according to the invention is configured to obstruct a generally annular process gas feed channel opening of the processing chamber. The gas distribution ring includes a series of relieved sections, grooves, or slots having predetermined dimensions which face the processing gas feed channel opening. Gas flows from the process gas feed channel into the slots in the surface of the gas distribution ring which provide a passage out to the processing chamber where the gas communicates with the substrate surface according to the process chamber gas flow pattern.

The annular process gas feed channel according to the invention may be an annular space between the outside surface of a dome covering the top of the processing chamber and the inside surface of a gas inlet ring. The inlet ring includes seals sealing the chamber dome to the walls of the lower section of the processing chamber and includes a gas passage through the inlet ring to an annular space forming the gas feed channel. A lower opening of the process gas feed channel faces the gas distribution ring supported on a shelf in the processing chamber wall. A lip of the process chamber dome (adjacent to the outside surface of the dome) rests against and is supported by a top surface of the gas distribution ring. For process gas to pass from the gas feed channel into the processing chamber, the gas must flow around the lip of the dome resting on the gas distribution ring. The slots in the surface of the gas distribution ring and the end surface of the lip of the dome form a discrete set of passages to convey the process gas from the process gas feed channel to the processing chamber in a particular gas introduction pattern.

The pattern of grooves in the gas distribution ring can be such that they are equally distributed around the generally circular process chamber with parallel sided type grooves or slots, equally distributed around the processing chamber with expanding slots (fan-shaped-triangle) towards the center of the processing chamber, provided in two sets of slots on opposite sides of the processing chamber such the gas flow sweeps across the substrate being processed generally equally from two opposite sides, or a set of parallel slots generally provided only at one end of the chamber such that there is a continuous gas sheet from that end towards the vacuum system nozzle(s) across a portion of the substrate being processed, or any other flow distribution pattern that can be devised within the constraints of the distribution ring.

The disclosed configuration according to the invention provides for easy cleaning or replacement of gas inlet and distribution components. The gas distribution ring acts as a spacer to separate the dome of the processing chamber from a lower processing chamber facilitating the removal of the dome. When the processing chamber dome is removed, the gas inlet ring can easily be lifted for access to the gas distribution ring. The gas distribution ring, once so exposed can be removed, cleaned and replaced or can easily be replaced with a different gas distribution ring having different slot configurations for different process conditions, i.e., different flow rates and/or process gases which might be utilized for different substrate materials and/or to obtain optimization of different preselected process parameters. Once the new gas distribution ring is in place, the inlet ring can be replaced, the dome can be re-installed, and a vacuum can be pulled to start the new process.

Configurations according to the invention overcome many of the difficulties evident in process gas supply systems. Any required changes in the gas distribution flow pattern are easily accommodated. Disassembly and reassembly is easy to acquire whenever gas flow passages need to be cleaned or replaced. The dome sealing arrangement is both easily disassembled and well protected from the corrosive chamber atmosphere by being relatively remote therefrom physically, as well as by being positioned adjacent the flow path of incoming process gas well upstream of the gas outlet slot, with a relatively long path length of flowing gas between the dome sealing and the gas outlet slots around a corner from and not directly in view of the ionized gas in the chamber.

DETAILED DESCRIPTION OF THE PREFERRED EMBODIMENT

Figure 1:
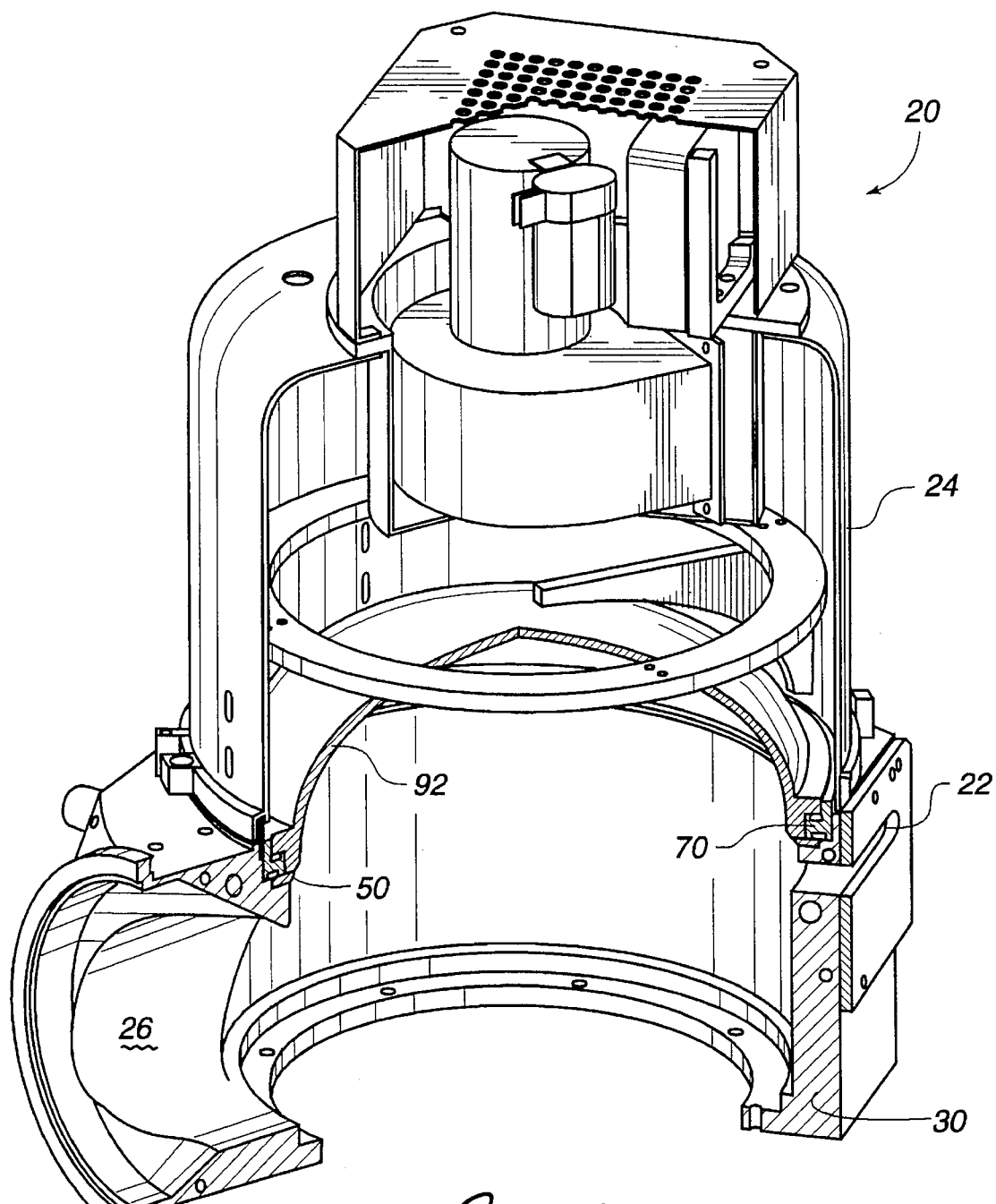
FIG. 1 shows a partial cross section of the perspective view of an etch chamber according to the invention.

The upper portion of an etch chamber according to the invention is shown in FIG. 1. The lower processing chamber section 30 includes a slot opening 22 to provide access to insert or remove substrates from the chamber. A piping nozzle 26 connects the process chamber to a vacuum system which evacuates the processing chamber during processing. A gas distribution ring 50 is supported by and inset into a shelf in the top circumference in the lower processing chamber section 30. An "L" shaped cross section inlet ring 70 is supported on both a land in the wall of the lower processing chamber section 30 and the gas distribution ring 50. A continuous processing chamber dome 92 covers the processing chamber and rests on both the inlet ring 70 and the gas distribution ring 50. An etch chamber upper assembly 20 above the dome 92 includes an upper housing 24 which surrounds the dome 92 and plasma antenna and other items above the dome.

Figure 2:
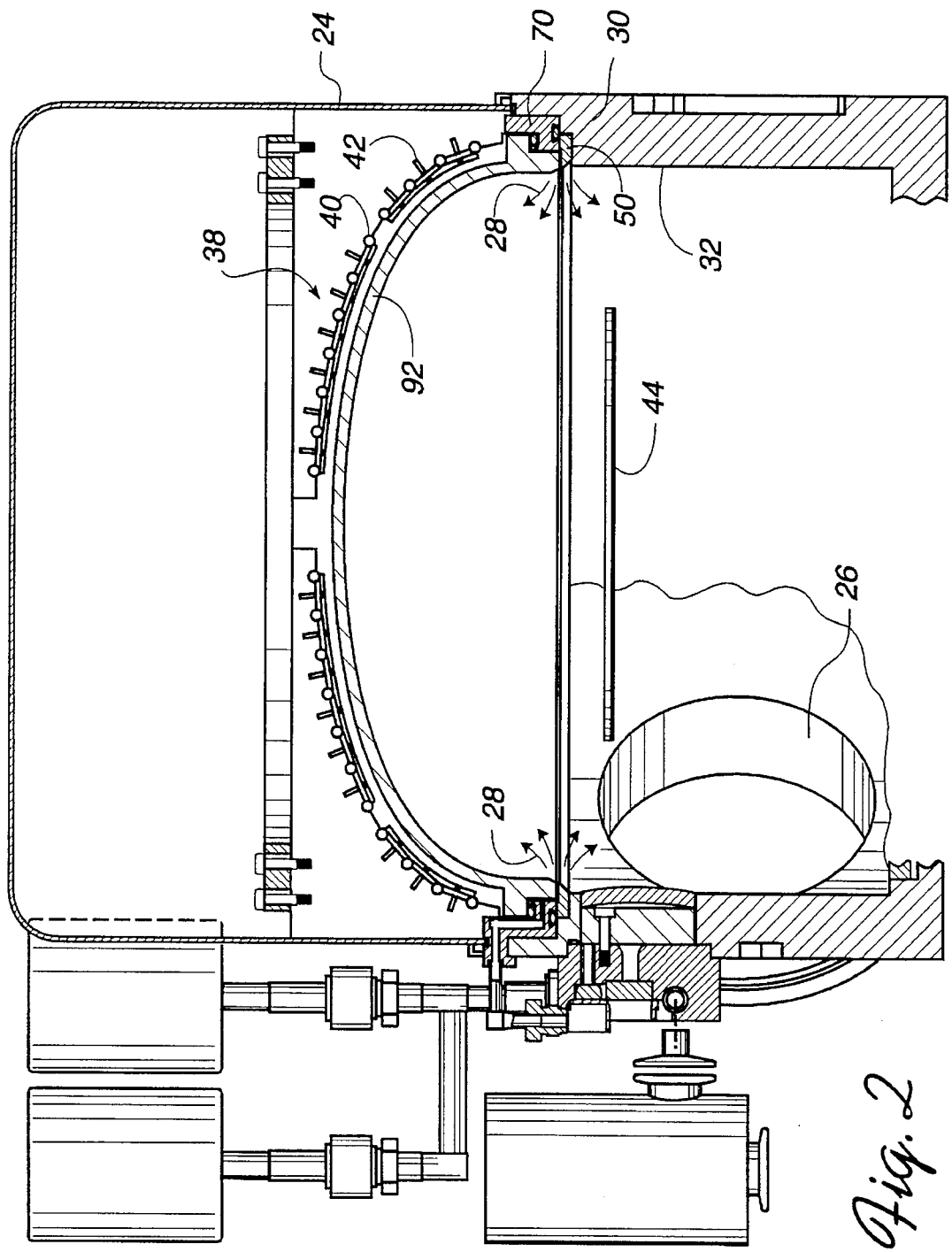
FIG. 2 shows a cross section of an etch chamber upper portion, similar to that shown in FIG. 1, according to the invention.

FIG. 2 shows a side cross section view of an etch processing chamber according to the invention. The lower processing chamber section 30 includes a lower processing chamber inner wall 32 which includes the piping nozzle opening 26 to a vacuum system. A substrate being processed 44 is supported approximately in the configuration shown by a substrate support pedestal (not shown). The upper housing 24 encloses an antenna 38 for activating and supporting a plasma in the processing chamber. The antenna 38 includes wire coils 40 mounted on a frame 42 on the outside of the dome 92. Process gas is delivered into the processing chamber by a gas passage through the inlet ring 70 and through relieved sections or slots in the top surface of the gas distribution ring 50. A nominal gas flow direction as the gas exits the gas distribution ring is shown by the arrows 28 which show the gas flow being directed into the chamber and towards the substrate being processed 44.

Figure 3:
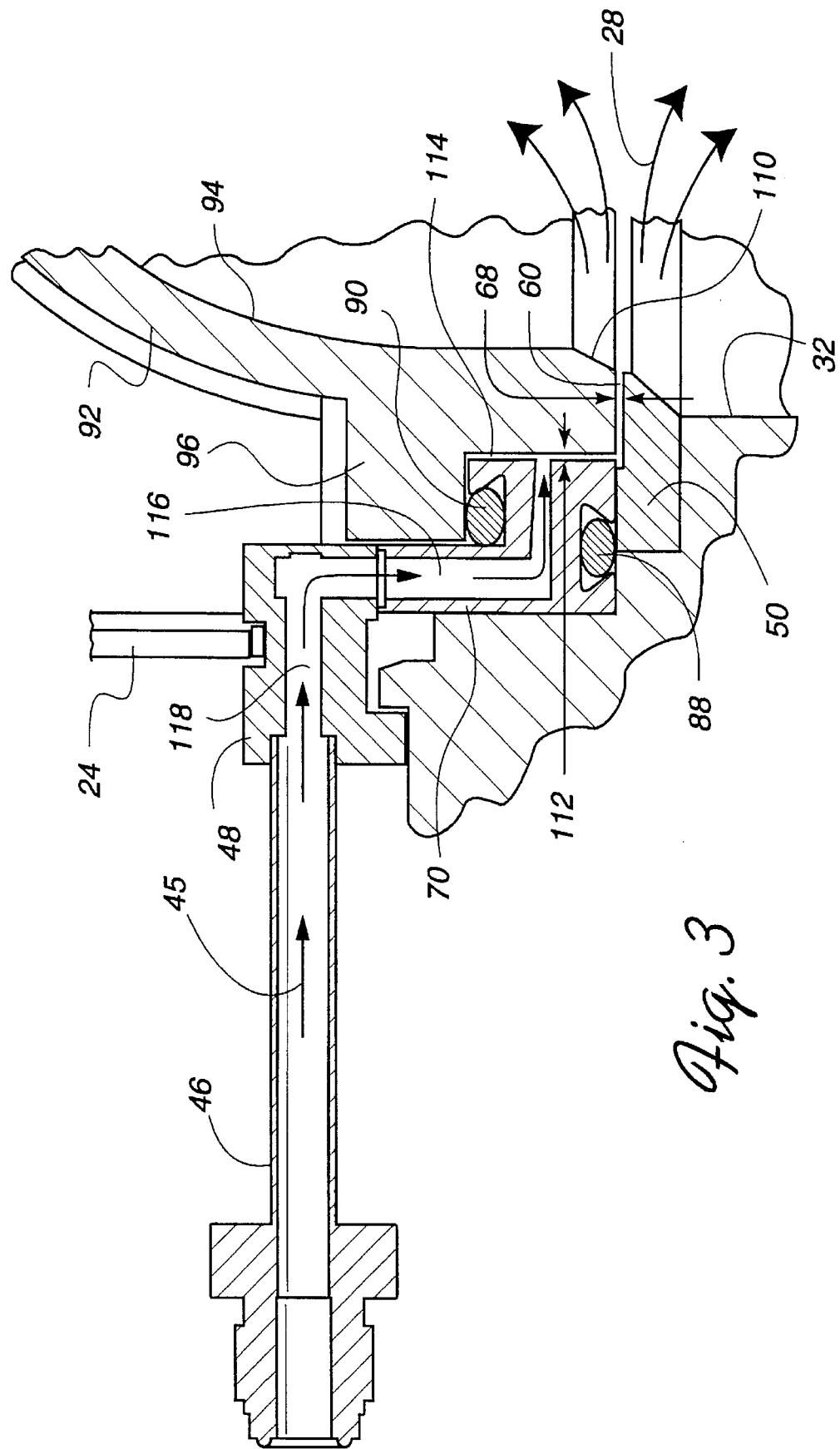
FIG. 3 shows a close-up view of the left side of FIG. 2 where the dome of the etch chamber meets the lower section of the processing chamber.
Figure 4:
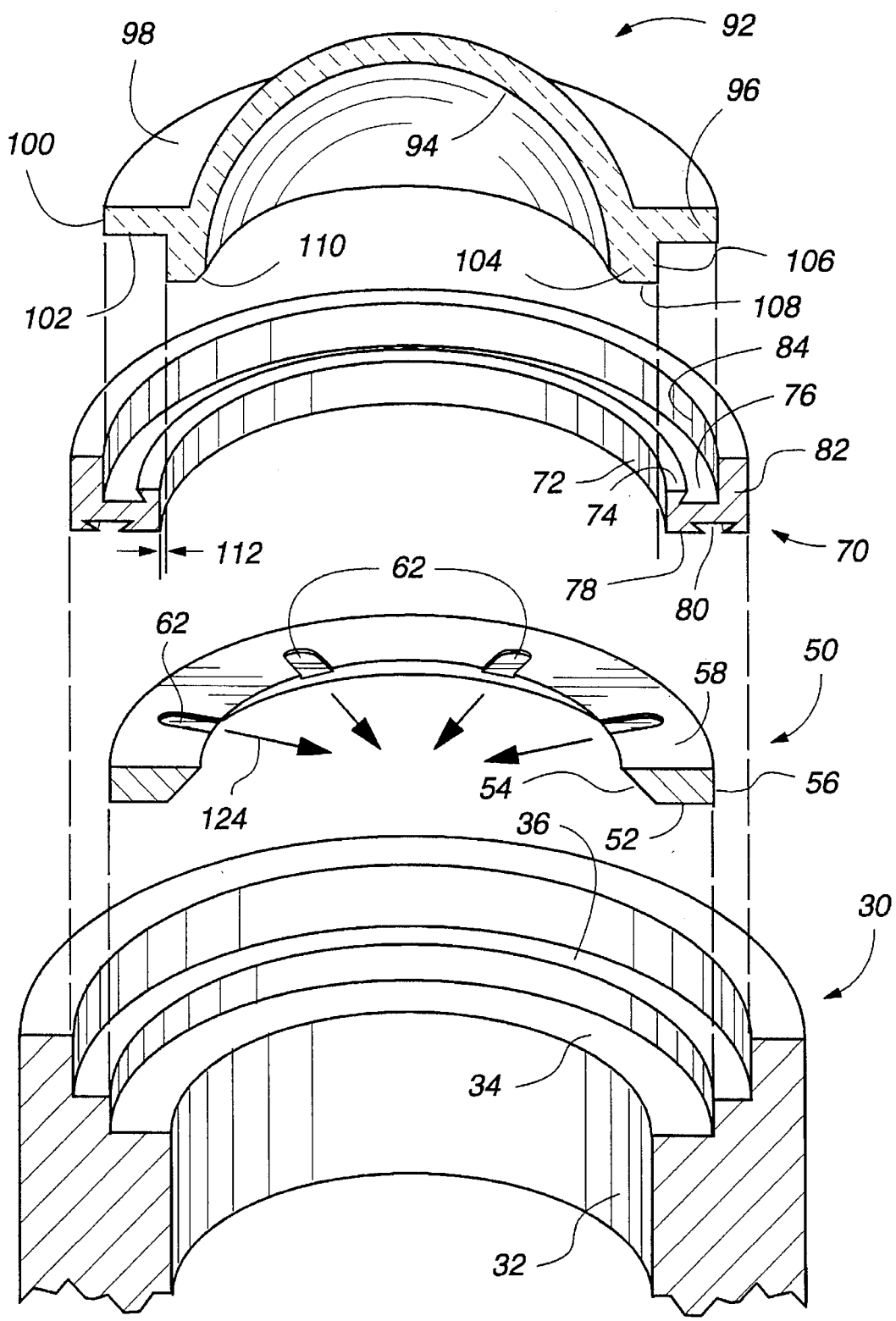
FIG. 4 shows a cross section exploded view of a top portion of an etch chamber according to the invention, the gas distribution ring being shown with slots generally equally spaced around the chamber.
Figure 5:
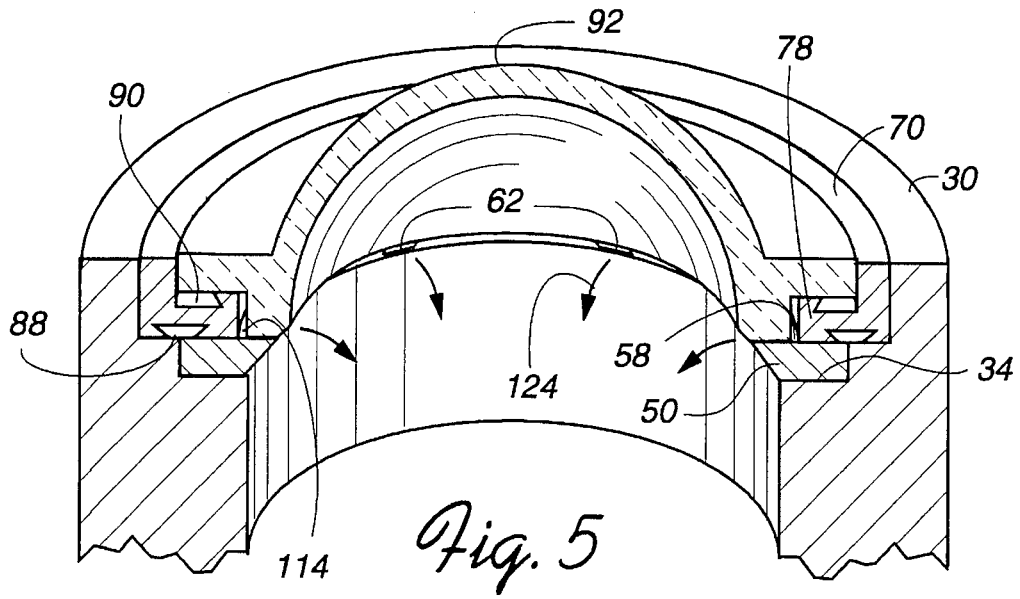
FIG. 5 shows an assembled cross section of the items of FIG. 4.

FIGS. 3, 4, and 5 show more detail of the various pieces of the processing chamber which provide and distribute process gas to the processing chamber while sealing the processing chamber dome 92 to the lower process chamber section 30. FIG. 4 provides an exploded view showing the configuration of various pieces as they are assembled. Dashed lines generally provide visual guides and show relationships between adjacent pieces when they are assembled. FIG. 3 provides a close-up detail of the gas distribution inlet arrangement view of FIG. 2, while FIGS. 4 and 5 generally schematically show the assembly of the pieces shown in FIGS. 2 and 3.

As can be seen in FIG. 4, the inner wall 32 of the lower processing chamber section 30 includes a distribution ring shelf 34 and inlet ring shelf 36. The gas distribution ring 50 includes a bottom surface 52 and an outer surface 56 whose height is generally equal to the height of the wall between the distribution ring shelf 34 and an inlet ring shelf 36 or may better be seen in FIGS. 5 and 3. When the gas distribution ring 50 is placed on the distribution ring shelf 34 it fits with minimal clearance and its top surface 58 is generally aligned with the surface of the inlet ring shelf 36. A series of generally equally spaced slots or grooves or surface relief 62 (shown only in FIGS. 4 and 5) are provided in the top surface 58 of the gas distribution ring 50. (A generic slot, groove, or surface relief 60 is pictured in FIG. 3).

The "L" shaped inlet ring 70 includes a bottom surface 78 to face both the top surface 58 of the gas distribution ring 50 and the top surface of the inlet ring shelf 36 of the lower processing chamber section 30. An O-ring groove 80 is provided in the inlet ring bottom surface 78 and is configured so that when assembled with an O-ring 88 in position, the O-ring 88 seals the joint between the edge of the inlet ring shelf 36 as well as the outer edge of the top surface 58 of the gas distribution ring 50 to the bottom 78 of the inlet ring 70. The O-ring 88 sealing across the gap between adjacent pieces provides vacuum sealing and also prevents gas flowing into the processing chamber from seeking a path behind the gas distribution ring 50. The outside of the vertical leg of the inlet ring 70 includes an outside circumferential surface 82 which rises vertically to generally match or slightly exceed the height of the edge of the lower processing chamber section 30. The top of the horizontal leg of the inlet ring 70 includes a top surface 74 having an O-ring groove 76. When during assembly an O-ring 90 is placed in position in the inlet ring top O-ring groove 76, it seals against a bottom surface 102 of a dome horizontal flange 96 as can be seen in FIGS. 3 and 5.

The processing chamber dome 92 includes the dome horizontal flange 96 extending horizontally from the dome around the outer circumference of the dome 92. The dome 92 is preferably made of quartz, or alumina, which is compatible with the high temperatures and corrosive atmosphere of the processing chamber. The dome horizontal flange 96 is configured so that the dome might be sealed without exposing the seal directly to the corrosive environment of the processing chamber. The dome horizontal flange 96 includes a top surface 98, an outside peripheral surface 100, and the bottom sealing surface 102, already mentioned. A dome lower lip 104 extends below the bottom of the horizontal flange 96. The dome lower lip 104 has an outside peripheral surface 106, a bottom surface 108, and an inner beveled surface 110.

The configuration of the dome lower lip 104 and the dome horizontal flange 96 is such that when the processing chamber is assembled the bottom surface 108 of the lower lip rests on the top surface 58 of the gas distribution ring 50; and the bottom surface 102 of the horizontal flange 96 of the process chamber dome 92 rests generally on the top surface 74 of the inlet ring 70 so that the top O-ring 90 can seal against the lower side 102 of the dome horizontal flange 96. The diametral dimension of the outer surface 106 of the lower lip 104 is smaller than the diametral dimension of the inlet ring inner circumference 72 such that a vertical channel 114 (FIG. 3) is created between the two surfaces having a width 112 (in this example approximately 0.030" or 0.76 mm). The channel 114 provides a channel opening at its bottom which is covered and thereby obstructed by the gas distribution ring 50.

Generally at one location around the periphery of the inlet ring 70 a gas inlet block 48 is provided. The gas inlet block 48 (connected to a gas inlet piping connection) provides process gas (e.g., BCl₃) to the processing chamber. Gas flow into the processing chamber through the gas feed piping is shown by the arrows 45 (FIG. 3). The gas inlet piping connection 46 connects to a gas inlet passage 118 in the gas inlet block 48 which is connected and sealed (seal not shown) to the gas passage 116 in the inlet ring 70. Gas flows down through the gas passage 116 at the center of the "L" shaped inlet ring 70 and connects to the vertical annular channel 114. Gas flows into the circumferential channel 114, around the periphery of the processing chamber, and into the processing chamber through the gas distribution ring slots or grooves or surface reliefs 60 (FIGS. 3 and 4) as shown by the arrows 28. Sufficient flow resistance must be provided in the surface slots of the gas distribution ring 50 so that a generally uniform gas pressure is achieved in the gas distribution channel 114 around the periphery of the processing chamber. When generally uniform pressure is achieved in the channel 114, the channel acts as a manifold or reservoir from which the process gas is uniformly discharged through the multitude of gas relief passages (such as 60) in the gas distribution ring 50.

Several possible slot or groove configurations in the top of the gas distribution rings 50 are shown in FIGS. 4, 6, 7, and 8. The gas distribution ring 50 of FIGS. 3 and 4 shows an example of slots 60 with a rounded end configuration 62 generally equally spaced around the edge of the processing chamber such that gas flow into the processing chamber is represented by the arrows 124.

FIG. 5 shows the same arrows 124 representing gas flowing into the center of the processing chamber from generally equally spaced slots 60 in the top of the gas distribution ring 50.

Figure 6:
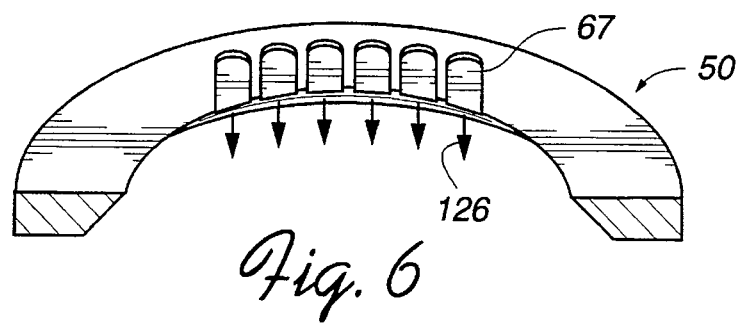
FIG. 6 shows a cross section of a gas distribution ring according to the invention with parallel end grooves at one end of the ring.

FIG. 6 shows a series of six (for example) parallel slots 67 providing a sheetlike flow from the gas distribution ring 50. If this configuration were placed directly opposite the vacuum system opening into the processing chamber, a generally horizontal linear flow might be expected (however this might not necessarily provide uniform deposition or etching as required by the process). The arrows 126 show the expected direction of flow.

Figure 7:
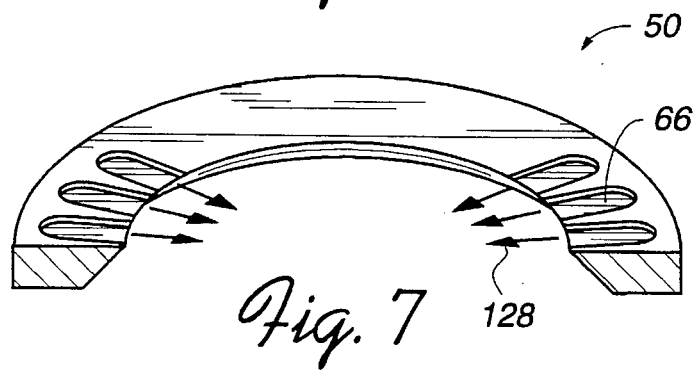
FIG. 7 shows a cross section of a gas distribution ring according to the invention configured with grooves on two sides to provide gas flow towards the center of the processing chamber.

FIG. 7 shows a set of two oppositely spaced slots 66 directing flow as represented by arrows 128 towards the center of the processing chamber from the gas distribution ring 50.

Figure 8:
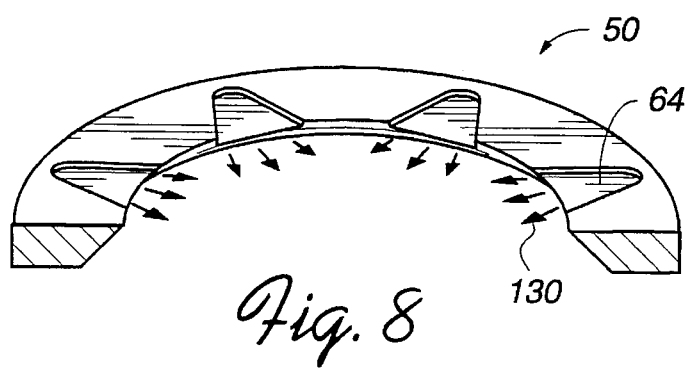
FIG. 8 shows a cross section of a gas distribution ring according to the invention configured with fan or triangle shaped slots providing gas flow to the processing chamber.

FIG. 8 shows a series of equally distributed fan or isosceles triangle shaped surfaces slots or grooves 64 facing the center of the processing chamber. The arrows 130 represent the generally expected configuration of flow from the gas distribution ring 50. The fan or isosceles triangle shape of the slots provides a reduced resistance to gas flow toward the center of the processing chamber through these slots when compared with the parallel wall slots 62 of FIG. 4.

During operation, as generally can be seen in FIG. 3, the gas flow from the gas inlet piping 46 flows through the gas inlet block to the inlet ring 70. The gas feed piping connection 46, inlet block 48, and inlet ring 70 (all preferably made of 316L type stainless steel) direct the process gas flow into the vertical channel 114 having a width 112. This vertical channel 114 is generally uniform around the periphery of the processing chamber and rests on the top surface 58 of the gas distribution ring 50. Gas flowing into the channel 114 is distributed around the periphery of the processing chamber and finds its way to the grooves or surface relief 60 in the top 58 of the gas distribution ring 50. The dimensions of the surface relief 60 are generally rectangular. The O-rings 88 and 90 are generally made of Viton™, Kalrez™ or Chemraz™. The process chamber dome 92 is generally made of ceramic (preferably alumina or quartz) and the gas distribution ring 50 is also preferably made of a ceramic (for example, alumina). The inside of the processing chamber 32 is preferably anodized aluminum. In this configuration all internal process chamber surfaces potentially exposed to the plasma within the processing chamber are highly resistant to corrosion from the process plasma (a plasma of boron trichloride (BCl$_3$) is often used).

During operation only the end of the slot 60 is exposed to the high temperature corrosive environment of the processing chamber thus shielding the stainless steel inlet ring 70 from the high temperature plasma etch gas in the processing chamber. To adjust the flow regime in the processing chamber, all that needs to be done is to raise the processing chamber dome 92 and the inlet ring 70 to provide access to the gas distribution ring 50. The gas distribution ring can then easily be re-configured or replaced as needed to change the flow regime in the processing chamber. The gas distribution ring 50 is simply configured so that a conventional machine operation (i.e., grinding) of the surface of the ceramic material of an unslotted gas distribution ring is all that is needed to change or adjust the flow configuration in the processing chamber. In this way users can adjust the flow regimes in their machines as they wish without special machining facilities. Similarly the number, location and dimension of passages may be easily created or adjusted in standard uncut gas distribution rings to improve uniformity of deposition or etching of a substrate being processed or to provide any number of standard predetermined flow regime choices. Meanwhile, the dome sealing not only is configured to avoid any direct exposure to the corrosive procession environments but also is further protected by being placed well upstream of gas outlet slots 60 and this with a relatively long column of incoming flowing gas between the dome sealing and the corrosive processing environment.

While the invention has been described with regards to specific embodiments, those skilled in the art will recognize the changes can be made in form and detail without departing from the spirit and scope of the invention.

I claim:

1. A processing chamber gas distribution manifold comprising:

a gas distribution ring configured to obstruct a generally annular gas feed channel opening of the processing chamber, wherein said gas distribution ring has a surface facing said opening, said surface including a set of grooves which are connected to, and provide a passage between, said opening and said processing chamber.

2. A processing chamber gas distribution manifold as in claim 1, wherein said set of grooves are generally equally distributed about the processing chamber.

3. A processing chamber gas distribution manifold as in claim 1, wherein said set of grooves are created according to a pattern, where said set of grooves are not generally equally distributed about the processing chamber.

4. A processing chamber gas distribution manifold as in claim 3, wherein said gas distribution ring is removable and replaceable.

5. A processing chamber gas distribution manifold as in claim 1, wherein said set of grooves are generally open to a center portion of said processing chamber and cause flow restrictions for gas flow emerging from said set of grooves in directions other than toward the center portion of said processing chamber, such that a substantial portion of the gas flow passing through said set of grooves is directed toward the center portion of said chamber, and a negligible portion of the gas flow passing through said set of grooves is directed in directions other than toward the center portion of said chamber.

6. A processing chamber gas distribution manifold as in claim 1, wherein said gas distribution ring is removable and replaceable.

7. A processing chamber gas distribution system comprising:

a chamber having a gas distribution opening forming a generally annular channel; and a gas distribution ring having a surface facing said opening, said surface including a set of grooves which are connected to, and provide a passage between, said opening and said processing chamber.

8. A processing chamber gas distribution system as in claim 7, wherein said chamber includes a dome portion and a gas feed ring surrounding said dome portion, wherein said gas distribution opening forming said generally annular channel includes opposing walls of said channel adjacent said opening, wherein a first wall of said opposing walls includes a surface of said dome portion and a second of said opposing walls includes a surface of said gas feed ring, such that said opening is formed between said surface of said dome portion and said surface of said gas feed ring.

9. A processing chamber gas distribution system as in claim 8, wherein said gas distribution ring acts as a spacer to separate said dome portion of said processing chamber from a lower processing chamber wall, such that only a portion of said ring is openly exposed to the gas in the processing chamber.

10. A processing chamber gas distribution system comprising:

a chamber dome section having an outer surface circumscribing a perimeter of said dome section;

a gas feed ring having an inner surface facing and spaced from said outer surface of said chamber dome section to provide a generally continuous annular gas distribution channel between said inner surface and said outer surface, wherein said gas feed ring includes seal features to seal between said chamber dome section and a circumferential wall of a processing chamber, wherein said wall of said processing chamber includes a shelf recess;

a gas distribution ring configured to be supported in said shelf recess, said ring having a top surface facing and generally in contact with said annular gas distribution channel to obstruct gas flowing from said gas distribution channel; said distribution ring including a set of gas passages from said opening of said gas distribution channel to an inside of said processing chamber.

11. A processing chamber gas distribution system as in claim 10, wherein said set of gas passages from said opening of said gas distribution channel to said inside of said processing chamber include a series of slots or grooves in said top surface of said gas distribution ring such that gas flow to said inside of said processing chamber from said annular gas distribution channel flows through a passage formed by the surface of said slots or grooves and the dome portion opposite said slots or grooves.

12. In an evacuable processing chamber having a dome for containing a substrate fabrication process and gas channels adapted to transmit process gas into the interior of the chamber, the improvement comprising:

a first annular generally flat end surface defining the outlet of the dome, and orthogonal to the dome axis of symmetry;

a second annular end surface on said dome located outwardly of and intersecting said first end surface;

a first ring positioned coaxially with said chamber at an outlet thereof and having generally flat parallel faces, one of which overlaps said first end surface while extending outwardly of said second end surface;

a second ring having a generally cylindrical inner face and positioned coaxially with said dome, with said inner face and said second end surface in an opposed facing relationship so as to define a confined thin annular space about said second end surface, said second ring having defined therein at least one passageway opening into said annular space and adapted to communicate with an external gas source;

said first ring being provided with a plurality of surface grooves extending from the innermost edge of said one surface outwardly to communicate with said annular space;

whereby gas may be evenly injected via said internal passageway, the annular space, and the grooves into the process chamber in a pattern controllable by the positions and configuration of said grooves.

13. The combination of claim 12 in which a first pressure sealer is provided between said first ring and said second ring outwardly of said annular space to provide a seal for said annular space downstream of said passageway outlet.

14. The combination of claim 13 in which a second pressure sealer is provided between an outer surface of said dome and said second ring outwardly of said annular space and oppositely from said first sealer to provide an effective seal for said annular space upstream of said passageway outlet.

15. The combination of claim 12 which further includes a chamber dome support defining recesses into which said first and second rings are embraced and supported, with said dome being secured to said rings and dome support in a gas-tight relationship.

16. The combination of claim 12, in which said dome is sealed to said second ring adjacent a periphery of said thin annular space and upstream of said opening of said internal gas passageway, such that the outlet sealing of the dome is protected by positive gas pressure against the processing environment within the processing chamber.

17. A processing chamber gas distribution manifold as in claim 2, wherein said gas distribution ring is removable and replaceable.

18. A processing chamber gas distribution manifold as in claim 5, wherein said gas distribution ring is removable and replaceable.

19. A processing chamber gas distribution system as in claim 7, wherein said gas distribution ring is removable and replaceable.

20. A processing chamber gas distribution system as in claim 8, wherein said gas distribution ring is removable and replaceable.

21. A processing chamber gas distribution system as in claim 9, wherein said gas distribution ring is removable and replaceable.

* * * * *